United States Patent
Brugger et al.

(10) Patent No.: US 6,867,111 B2
(45) Date of Patent: Mar. 15, 2005

(54) METHOD OF MANUFACTURING MODULES WITH AN INTEGRATED CIRCUIT

(75) Inventors: Christian Brugger, Graz (AT); Reinhard Fritz, Graz (AT); Anthonie Arie De Lange, Eindhoven (NL); Johannes Henricus Maria Van Roosmalen, Sint Oedenrode (NL); Johannus Wilhelmus Weekamp, Beek en Donk (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 186 days.

(21) Appl. No.: 10/281,691

(22) Filed: Oct. 28, 2002

(65) Prior Publication Data

US 2003/0087474 A1 May 8, 2003

(30) Foreign Application Priority Data

Oct. 31, 2001 (EP) ............................................. 01890303

(51) Int. Cl.⁷ ............................................... H01L 21/301
(52) U.S. Cl. ........................................................ 438/460
(58) Field of Search ................................. 438/460–465, 438/907

(56) References Cited

U.S. PATENT DOCUMENTS 6,133,835 A * 10/2000 DeLeeuw et al. ......... 340/572.5

* cited by examiner

*Primary Examiner*—Richard A. Booth
(74) *Attorney, Agent, or Firm*—Kevin Simons

(57) ABSTRACT

In a method of manufacturing modules (4), each with at least one integrated circuit (2), the integrated circuits (2) are separated from a previously manufactured circuit configuration (1), which is in the form of a flexible film comprising a plurality of integrated circuits (2) on the basis of a polymer, by a combined stamping-vacuum conveying device (6), after which each of the separated integrated circuits (2) is conveyed to a module substrate (5) and connected to the module substrate (5) so as to form a module (4).

2 Claims, 1 Drawing Sheet

METHOD OF MANUFACTURING MODULES WITH AN INTEGRATED CIRCUIT

The invention relates to a method of manufacturing modules, wherein each module comprising at least one integrated circuit and wherein the integrated circuits are separated from a previously realized circuit configuration comprising a plurality of integrated circuits, and wherein subsequently each of the separated integrated circuits is conveyed to a module substrate and is connected to the module substrate in order to form a module.

The invention further relates to a module with a module substrate and at least one integrated circuit which is connected to the module substrate in order to form the module.

The invention further relates to a transponder with a module, said module comprising a module substrate and at least one integrated circuit which is connected to the module substrate in order to form the module and which has connection contacts which are connected to transmission means of the transponder.

A method as described in the first paragraph has long been known. The known method is a method for the manufacture of modules with at least one integrated circuit each on a silicon base. In this situation, the manufacturing of the integrated circuits takes place on so-called wafers, each wafer forming a circuit configuration. Such a wafer is first bonded to a transport foil and the wafer is then cut up by a diamond saw, the saw blade being adjusted such that the individual integrated circuits are separated from one another, i.e. made discrete, but the subjacent transport foil is not cut up. The transport foil thus allows the integrated circuits to retain their predetermined positions even after the sawing process. After sawing, the transport foil with the sawn wafer, i.e. with the integrated circuits separated from one another, is transferred to a so-termed "pick and place" machine with which the individual integrated circuits are taken up and then placed and fixed on a module substrate.

The known method described briefly above is suitable only for the manufacture of modules with integrated circuits on a silicon base. More recently, however, integrated circuits have been manufactured not only on a silicon base but also on polymer bases. Such polymer ICs are processed on a flexible film made of plastic. The known method cannot be applied to polymer ICs manufactured on such plastic flexible films.

It is an object of the invention to create a method of manufacturing modules with at least one integrated circuit whereby the integrated circuits are processed on a film made of plastic and manufactured on the basis of a polymer.

To achieve the above object, inventive features are provided for a method according to the invention such that a method according to the invention can be characterized in the following manner, namely:

A method of manufacturing modules, wherein each module comprising at least one integrated circuit, and wherein the integrated circuits are separated from a previously realized circuit configuration comprising a plurality of integrated circuits, and wherein subsequently each of the separated integrated circuits is conveyed to a module substrate and is connected to the module substrate in order to form a module, and wherein the separation of the integrated circuits is carried out from a circuit configuration, which takes the form of a flexible film and contains the integrated circuits on the basis of a polymer, and wherein the separation and conveying of each integrated circuit is carried out by a combined stamping-vacuum conveying device, said combined stamping-vacuum conveying device comprising stamping means as well as vacuum conveying means, and wherein the separation is effected in a stamping process carried out by the stamping means for stamping out each integrated circuit from the circuit configuration, and wherein the conveying is effected in a conveying process carried out by the vacuum conveying means.

The features according to the invention provide a method by which modules with at least one integrated circuit each can be manufactured in a particularly simple and advantageous manner on the basis of a polymer. A particular advantage which may be mentioned in comparison with known methods for the manufacture of modules with integrated circuits on a silicon base is that, with a method according to the invention, elaborate processing stages, such as the bonding on a transport foil and the separation of the individual integrated circuits with a diamond saw, can be dispensed with, which is highly advantageous for achieving a manufacturing method which is as simple and as economical as possible. A further advantage of the method according to the invention is that the result is achieved with relatively few process steps.

With a method according to the invention, it has proved to be very advantageous to provide, in addition, the features according to claim 2. The provision of these features can guarantee a high degree of manufacturing precision and manufacturing reliability.

A module according to the invention is characterized in that the module comprising a substrate and at least one integrated circuit which is connected to the module substrate in order to form the module, and in that the module is manufactured by a method according to the invention.

A transponder according to the invention is characterized in that the transponder comprising a module, said module comprising a module substrate and at least one integrated circuit which is connected to the module substrate in order to form the module and which has connection contacts connected to transmission means of the transponder, wherein the module is manufactured by a method according to the invention.

These and other aspects of the invention are apparent from and will be elucidated with reference to the embodiment described hereinafter.

The invention is further described in greater detail with reference to an embodiment shown in the drawings, to which, however, the invention is not restricted.

Figure 1:
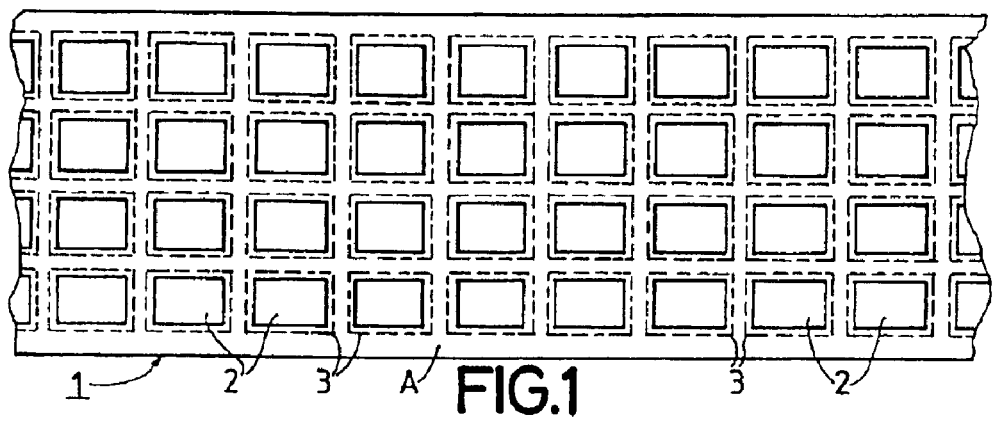
FIG. 1 shows in strongly diagrammatic form a circuit configuration in the form of a flexible film with a plurality of integrated circuits on the basis of a polymer.

FIG. 1 shows a circuit configuration 1 in diagrammatic form. The circuit configuration 1 in this case is present in the form of a flexible film made of plastic. The circuit configuration 1 comprises a plurality of integrated circuits 2, said integrated circuits 2 being manufactured on a polymer base. The integrated circuits 2 in this case are located at a distance from one another, which is necessary in order to be able to separate the integrated circuits 2 along separation zones 3, and thereby to allow a separation of the integrated circuits 2. The separation zones 3 are indicated diagrammatically by broken lines in FIG. 1. Each of the integrated circuits 2 here has two connection contacts (or "bumps"), which are not shown in FIGS. 1 to 4. Said connection contacts of the integrated circuits 2 lie in the area of a delimitation surface A of the circuit configuration 1, said delimitation surface A being visible in FIG. 1.

Figure 4:
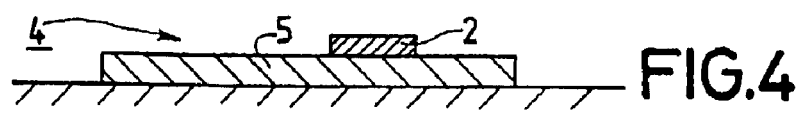
FIG. 4 shows a module according to the invention.

A method according to the invention of manufacturing modules 4 according to the invention will be described below with reference to FIGS. 1 to 4. FIG. 4 shows such a module 4 diagrammatically. In the present case, each module 4 comprising only a single integrated circuit 2. This does not necessarily have to be the case, however, because a module 4 according to the invention may also comprise more than one integrated circuit 2, for example two or three such integrated circuits 2. In the method of manufacturing the modules 4 from a circuit configuration 1 prepared beforehand and comprising a plurality of integrated circuits 2, the integrated circuits 2 are separated from said circuit configuration 1. Then each of the integrated circuits 2 is conveyed to a module substrate 5 (see FIGS. 3 and 4) and is connected to the module substrate 5 in order to form a module 4, this connection being effected here by the creation of an adhesive bond. The connection of an integrated circuit 2 to a module substrate 5 may, however, be effected by alternative means, for example by soldering or ultrasonic welding, and preferably with the use of the combined stamping-vacuum conveying device 6 suitably designed for this purpose.

The separation of the integrated circuits 2 from the circuit configuration 1 is carried out by the method according to the invention, said circuit configuration 1 being present in the form of a flexible film and comprising integrated circuits 2 on the basis of a polymer. In the method according to the invention, the separation and conveying of each integrated circuit 2 is carried out by a combined stamping-vacuum conveying device 6, which is shown in highly diagrammatic form in FIGS. 2 and 3 in three operating positions. The combined stamping-vacuum conveying device 6 has adjustment means 7 by which the combined stamping-vacuum conveying device 6 can be set for in its different operating positions. The combined stamping-vacuum conveying device 6 also has stamping means 8 and vacuum conveying means 9.

The stamping means 8 have a retaining part 10 which is displaceably guided along the adjustment means 7 parallel to the direction indicated by the double arrow 15. The retaining part 10 has a hollow cylindrical and rectangular cross-section. Stamping tools 11 project from the retaining part 10. The stamping tools 11, which are designed as cutters in the area of their free ends, render it possible for one integrated circuit 2 to be stamped out from the circuit configuration 1 each time, given an appropriate adjustment of the retaining part 10 relative to the adjustment means 7. The method according to the invention thus causes the separation to take place in a stamping process carried out by the stamping means 8 for stamping out each integrated circuit 2 from the circuit configuration 1.

Located in the interior of the stamping means 8 are the vacuum conveying means 9, which, like the stamping means 8, are displaceably guided along the adjustment means 7. The vacuum conveying means 9 consist essentially of a suction cylinder 12 with a rectangular cross-section, in which suction cylinder 12 a suction channel 13 is provided, and a vacuum line 14 connected to the suction channel 13, which line is connected to a vacuum-generating device (not shown). The vacuum conveying means 9 are adjustable in relation to the stamping means 8 parallel to the direction indicated by the double arrow 15, and specifically between a retracted position away from the free ends of the stamping parts 11 and a forward position towards the free ends of the stamping parts 11, as can be seen from FIGS. 2 and 3. The method according to the invention effects the transport of each integrated circuit 2 in the conveying process carried out by the vacuum conveying means 9.

In the method according to the invention, the circuit configuration 1 (see FIG. 2) is conducted to a vacuum holding table 16 before the separation of the integrated circuits 2. The vacuum holding table 16 consists essentially of a plate 17 in which a plurality of suction channels 18 are provided, which are all connected to a vacuum-generating device (not shown in FIG. 2). The vacuum holding table 16 brings the circuit configuration 1 and the combined stamping-vacuum conveying device 6 into a large number of positions relative to one another such that, when the circuit configuration 1 is held by the vacuum holding table 16 in a relative position with respect to the combined stamping vacuum conveying device 6, the stamping out of the individual integrated circuit 2 is carried out. The vacuum holding table 16 is a so-termed XY table which is capable of adjustment in two directions perpendicular to one another, so that each of the integrated circuits 2 can be brought into a stamping position in which the integrated circuit 2 concerned is positioned opposite the combined stamping-vacuum conveying device 6, whereupon the integrated circuit 2 concerned can be stamped out by the stamping means 8. Suction channels 18 which can no longer be in vacuum connection with the circuit configuration 1 after the separation and removal of an integrated circuit 2 from the circuit configuration 1 are automatically taken out of operation.

The sequence of the method according to the invention will be briefly described below.

After the manufacture of the circuit configuration 1, which manufacture may have taken place at a location remote from the location where the method is carried out, the completed circuit configuration 1 is conducted to the vacuum holding table 16 such that the circuit configuration 1 comes into contact with the vacuum holding table 16 by its delimitation surface A, so that the connection contacts of the integrated circuits 2 face the vacuum holding table 16, and consequently are located at the side of the circuit configuration 1 which faces away from the combined stamping-vacuum conveying device 6. In this situation, the circuit configuration 1 is brought into a precisely defined position relative to the combined stamping-vacuum conveying device 6 each time by positioning means (not shown).

Figure 2:
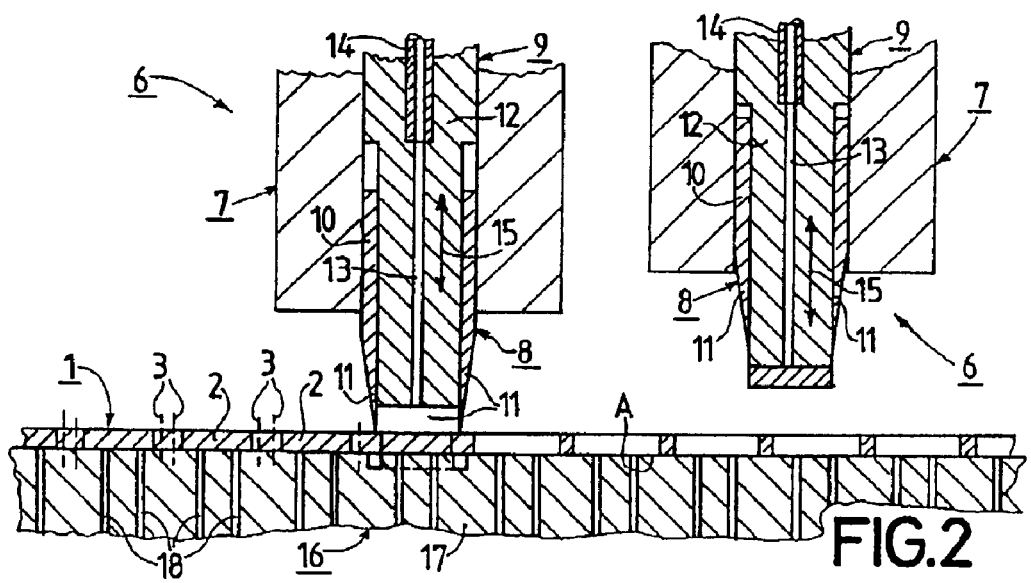
FIG. 2 shows in diagrammatic form a section of a vacuum retaining table and a combined stamping-vacuum conveying device, as well as the circuit configuration of FIG. 1.
Figure 3:
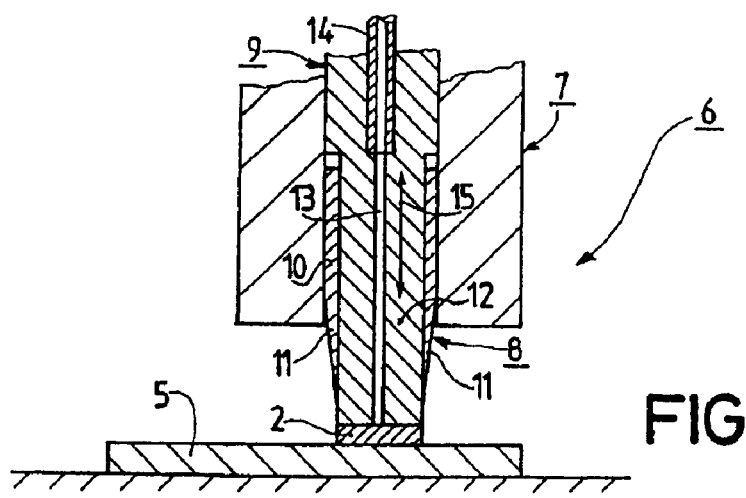
FIG. 3 shows the stamping-vacuum conveying device together with an integrated circuit, with the integrated circuit placed on a module substrate.

After the conclusion of this step of the method, an integrated circuit 2 is stamped out by the stamping means 8 of the combined stamping-vacuum conveying device 6 in that the stamping means 8 are moved towards the vacuum holding table 16, as indicated in FIG. 2. In the course of the stamping process carried out by the stamping means 8, and specifically towards the end of the stamping process, the vacuum conveying means 9 comes into effective contact with the stamped-out integrated circuit 2, whereby a vacuum effect is exerted via the suction channel 13 on the stamped-out integrated circuit 2, so that the stamped-out integrated circuit 2 is securely held by the vacuum conveying means 9. In a further sequence, the stamping means 8 are pushed against the vacuum conveying means 9, so that the stamping means 8 are moved into a position retracted from the stamped-out integrated circuit 2, as can be seen from FIGS. 2 and 3.

In a further sequence, the adjustment means 7 move the combined stamping-vacuum conveying device 6 such that the stamped-out integrated circuit 2 held by the vacuum conveying means 9 is conveyed to a module substrate 5 (see FIG. 3), after which the integrated circuit 2 is connected to the module substrate 5 so as to form a module 4, which is carried out in that an adhesive is applied to the module substrate 5 before the placement of the integrated circuit 2 on the module substrate 5 by the vacuum conveying means 9. After the placement of an integrated circuit 2 on the module substrate 5 and hardening of the previously applied adhesive, a finished module according to the invention is obtained. The hardening of the adhesive applied takes place without additional aids in this case. It is alternatively possible to provide a solution, however, in which the combined stamping-vacuum conveying device 6 is additionally provided with heating means such that said heating means arranged above the integrated circuit 2 heat the adhesive applied beforehand to the module substrate 5, thus hardening or curing the adhesive.

With the method according to the invention, the fact that the circuit configuration 1 is located with its delimitation surface A on the vacuum holding table 16, and consequently the projecting connection contacts of an integrated circuit 2, which has been stamped out and is therefore separate, are located at the side of the separated integrated circuit 2 which faces away from the combined stamping-vacuum conveying device 6, provides the advantage that the integrated circuit is placed on the module substrate 5 in a manner compliant with the so-termed flip-chip technology.

It remains to be mentioned that a module 4 according to the invention is an intermediate product intended and designed for the manufacture of a so-called transponder. Since such transponders have long been known per se, no separate graphic representation of such a transponder is included here. There are a number of possibilities for the structural design of an intermediate product, i.e. of the module 4. Such a module may comprise a module substrate 5 on which two relatively large-area connection contact surfaces are provided to which the connection contacts of the integrated circuit 2 of the module 4 are connected in an electrically conductive manner, and with the aid of which an electrically conductive connection can be easily established with transmission means, such as a transmission coil, said transmission means forming, together with the module 4 according to the invention, a transponder according to the invention for contact-free communication with a communication station. Another possible embodiment for a module 4 according to the invention consists in a module 4 already being provided on its module substrate 5 with transmission means, such as a transmission coil, whereby the connection contacts of the integrated circuit 2 of the module 4 are then connected to two transmission means connection contacts of the transmission means. A further possibility for the formation of a module 4 according to the invention is that, in the manufacture of such a module 4, first the integrated circuit 2 is connected to the module substrate 5, and specifically in such a manner that the connection contacts of the integrated circuit 2 face away from the module substrate 5, and that, after the connection of the integrated circuit 2 to the module substrate 5, for example in a pressure process, a transmission means is applied to the module substrate 5 and to the connection contacts of the integrated circuit 2 simultaneously.

It may also be mentioned that, instead of a vacuum holding table 16, another design of table may be used, in which the circuit configuration 1 is held at its edges and, as a result, is held on the table under tension. It may further be mentioned that, with the use of a vacuum holding table 16, the design of this vacuum holding table 16 may be chosen such that its suction channels 18 interact with the circuit configuration 1 in the areas located between the integrated circuits 2, i.e. with the film, so that, a good retention of the remaining portion of the circuit configuration 1 is guaranteed also after stamping out of the integrated circuits 2.

What is claimed is:

1. A method of manufacturing modules (4), wherein each module comprising at least one integrated circuit (2), and wherein the integrated circuits (2) are separated from a previously realized circuit configuration (1) comprising a plurality of integrated circuits (2), and wherein subsequently each of the separated integrated circuits (2) is conveyed to a module substrate (5) and is connected to the module substrate (5) in order to form a module (4), and wherein the separation of the integrated circuits (2) is carried out from a circuit configuration (1), which takes the form of a flexible film (1) and contains the integrated circuits (1) on the basis of a polymer, and wherein the separation and conveying of each integrated circuit (2) is carried out by a combined stamping-vacuum conveying device (6), said combined stamping-vacuum conveying device (6) comprising stamping means (8) as well as vacuum conveying means (9), and wherein the separation is effected in a stamping process carried out by the stamping means (8) for stamping out each integrated circuit (2) from the circuit configuration (1), and wherein the conveying is effected in a conveying process carried out by the vacuum conveying means (9).

2. A method as claimed in claim 1, wherein the circuit configuration (1) is fed to a vacuum holding table (16) before the separation of the integrated circuits (2), and wherein the circuit configuration (1) is held by the vacuum holding table (16), and wherein the stamping out of the integrated circuits (2) takes place while the circuit configuration (1) is being held by the vacuum holding table (16).

* * * * *